United States Patent [19]

Orlowski et al.

[11] Patent Number: 5,153,023

[45] Date of Patent: Oct. 6, 1992

[54] PROCESS FOR CATALYSIS OF ELECTROLESS METAL PLATING ON PLASTIC

[75] Inventors: Thomas E. Orlowski, Fairport, N.Y.; James Duff, Mississauga, Canada; Joan R. Ewing, Fairport, N.Y.; Joseph A. Swift, Ontario, N.Y.; Raymond E. Bailey, Webster, N.Y.

[73] Assignee: Xerox Corporation, Stanford, Conn.

[21] Appl. No.: 621,687

[22] Filed: Dec. 3, 1990

[51] Int. Cl.$^5$ .......................... B05D 3/06; B05D 5/12; B05D 3/02; B05D 3/10

[52] U.S. Cl. ........................... 427/555; 427/96; 427/98; 427/229; 427/304; 427/305; 427/306

[58] Field of Search .................. 427/53.1, 96, 98, 226, 427/229, 304, 305, 306

[56] References Cited

U.S. PATENT DOCUMENTS

| | | | |
|---|---|---|---|
| 4,388,387 | 6/1983 | Tsuboi | 430/7 |
| 4,444,836 | 4/1984 | Khattab | 427/306 |
| 4,469,714 | 9/1984 | Wada et al. | 427/306 |
| 4,496,607 | 1/1985 | Mathias | 427/53.1 |
| 4,526,807 | 7/1985 | Auerback | 427/53.1 |
| 4,574,095 | 3/1986 | Baum et al. | 427/53.1 |
| 4,622,069 | 11/1986 | Akai et al. | 427/229 |
| 4,681,774 | 6/1987 | Halliwell et al. | 427/53.1 |
| 4,692,387 | 9/1987 | Reich | 427/53.1 |
| 4,701,351 | 10/1987 | Jackson | 427/305 |
| 4,814,259 | 3/1989 | Newman et al. | 430/319 |
| 4,841,099 | 6/1989 | Epstein et al. | 174/68.5 |
| 4,853,252 | 8/1989 | Frankel et al. | 427/53.1 |
| 4,900,581 | 2/1990 | Stuke et al. | 427/53.1 |
| 4,981,715 | 1/1991 | Hirsch et al. | 427/53.1 |
| 5,034,245 | 7/1991 | Matsubara | 427/53.1 |
| 5,106,462 | 4/1992 | Kawakawi et al. | 427/96 |

OTHER PUBLICATIONS

"Laser Direct Copper on Polyimide for High Speed Interconnections" by Cole et al., G.E. Research and Development Center, Power Electronics Laboratory, 88CRD323, Feb. 1989.

"Laser-Induced Selective Copper Deposition on Polyimide" by Cole et al., Applied Physics Letters 53921, Nov. 21, 1988, pp. 2111-2113.

"Laser Processing for Interconnect Technology" by Cole et al., SPIE, vol. 877, Micro-Optoelectronic Materials, 1988, pp. 92-96.

"Laser Activated Copper Deposition on Polyimide" Abstract #445, The Electrical Chemical Society, for meeting Oct. 18-23, 1987.

"Laser Direct Write Metallization in Thin Palladium Acetate Film" Gross et al., general applied physics, (61) Feb. 15, 1987, 1628-1632.

"Metal Plating of Pyrolyzate Circuitry" by Saunders et al., vol. 9, No. 11, Apr. 1967, p. 1474, IBM Technical Disclosure Bulletin.

Primary Examiner—Marianne Padgett

[57] ABSTRACT

A method of forming at least one electrically conductive path in a plastic substrate comprising providing a thermoplastic substrate having a melting point below 325° C., coating said substrate with a precursor of a catalyst for the electroless deposition of conductive metals, said catalyst precursor having a decomposition temperature below the melting point of said thermoplastic and within the temperature range where said thermoplastic softens, heating the portion of said coated thermoplastic substrate corresponding to said conductive path to a temperature sufficient to decompose said catalyst precursor to said catalyst and soften said thermoplastic; said substrate, catalyst precursor and temperature being selected such that on heating to the temperature the precursor decomposes to the catalyst, the thermoplastic softens and at least partially melts without substantial decomposition to enable the catalyst to penetrate the surface of the thermoplastic and become anchored thereto to provide nucleation sites for the subsequent electroless deposition of conductive metal and depositing conductive metal by electroless deposition on said heated portion to form said conductive path.

18 Claims, 4 Drawing Sheets

PROCESS FOR CATALYSIS OF ELECTROLESS METAL PLATING ON PLASTIC

CROSS REFERENCE TO RELATED APPLICATION

Attention is directed to commonly assigned U.S. application Ser. No. 07/445,230, filed Dec. 4, 1989, in the name of Thomas E. Orlowski et al., and entitled Electrical Component With Conductive Path.

BACKGROUND OF THE INVENTION

The present invention relates generally to electrical components, methods for making electrical components and the machines employing electrical components. In particular, it relates to electrical components having an electrically conductive path in a thermoplastic substrate formed by the electroless deposition of conductive metals on a path or pattern of nucleation sites of catalyst for the electroless deposition of conductive metals anchored in the thermoplastic. More specifically, the electrical component may be a planar member, a two-sided circuit board, or a frame or structural member in a machine such as automatic reprographic machines, including office copiers, duplicators and printers. In a typical electrostatographic reproducing machine, a photoconductive insulating member is uniformly charged and exposed to a light image which discharges the exposed or background areas and creates an electrostatic latent image on the member corresponding to the image contained within the original document. Alternatively, a light beam such as a laser beam may be modulated and used to selectively discharge portions of the photoconductive surface to record the desired information thereon. The electrostatic latent image is made visible by developing the image with developer powder referred to in the art as toner which may be subsequently transferred to a support surface such as paper to which it may be permanently affixed by the application of heat and pressure.

In commercial applications of such products, it is necessary to distribute power and/or logic signals to various sites within the machine. Traditionally, this has taken the form of utilizing conventional wires and wiring harnesses in each machine to distribute power and logic signals to the various functional elements in an automated machine. While the conventional approach has been immensely effective in producing convenience products, with increasing demands on manufacturing cost and the desire for automated assembly, different approaches have to be provided. For example, since individual wires and wiring harnesses are inherently very flexible, they do not lend themselves to automated assembly such as with the use of robotics. Furthermore, such harnesses may have to be handled or moved several times to make all connections required. This is a highly labor intensive task, frequently requiring routing of the several harnesses through channels and around components manually with the final connections being also accomplished manually, thereby resulting in potential human error in the assembly. The potential for human error is reduced with the use of automated and in particular robotic assembly. In addition to the relatively high labor costs associated with harness construction and installation of electrical wiring harnesses it is well to note that they are less than totally reliable in producing their intended function. Furthermore, and with increasing sophistication of the capabilities of such products, a plurality of wiring harnesses may be required in any individual machine which can require a large volume of space thereby increasing the overall size of the machine. Accordingly, there is a desire to provide an alternative to the conventional wiring and wiring harnesses that overcomes these difficulties.

PRIOR ART

In U.S. Pat. No. 4,841,099 to Epstein, et al. it has recently been proposed to provide electrical components and support members for a machine with continuous electrically conducting paths between electrical components formed by the in situ heat conversion of electrically insulating fibrous filler material held within an electrically insulating structural polymer matrix. The electrically conductive pattern may be formed by exposure of the component or the support member to a laser beam through a mask containing the desired pattern or by moving the laser or support member appropriately to achieve the desired pattern. Subsequent to the formation of the electrically conductive trace or path, the pattern may be electroplated if desired to attain metallic conductivity.

Another recent development is the laser irradiation of organometallic palladium compounds with an argon ion laser to selectively deposit catalytic amounts of palladium on polyimide. Subsequent immersion of the irradiated samples in an electroless copper solution results in copper deposition. Since a few monolayers of palladium are sufficient to catalyze the electroless copper process fast laser writing speeds of several centimeters per second are obtained. For further details of this technique, attention is directed to "Laser Direct Write Copper on Polyimide for High Speed Interconnections" by Cole et al., G. E. Research and Development Center, Power Electronics Laboratory, 88CRD323, February 1989;

"Laser-Induced Selective Copper Deposition on Polyimide" by Cole et al., Applied Physics Letters 53(21), Nov. 21, 1988, pages 2111–2113.

"LASER PROCESSING FOR INTERCONNECT TECHNOLOGY" by Cole et al., SPIE, Volume 877, Micro-Optoelectronic Materials, 1988, pages 92–96.

"Laser Activated Copper Deposition on Polyimide" Abstract #445, The Electrical Chemical Society, for meeting Oct. 18–23, 1987. Extended Abstracts, Volume 87-2.

One advantage of this process, discussed at page 2112, left column, is that since the polyimide is thermally stable to a temperature greater than 400° Centigrade and the palladium compounds decompose at about 225° Centigrade, a large process window is available where decomposition to palladium metal occurs without damage to the underlying polyimide.

A particularly troublesome difficulty with this process is the poor adhesion between the metals and the polyimide substrate. This poor adhesion may be simply determined through use of the adhesive tape test, wherein the plated area of the plastic is contacted with a piece of adhesive tape, which upon removal, removes the metal from the plastic, thereby interrupting the continuity of the conductive path. Conventional ways of eliminating this problem include mechanically roughening the surface of the plastics, such as with sand or glass bead blasts, plasma etching of the surface or hot chemical treatment, such as with chromic acid to roughen the plastic surface. Most of these techniques require several steps to produce a finished product.

SUMMARY OF THE INVENTION

The present invention is directed to electrical components, methods for making electrical components and machines employing such electrical components. In a specific aspect of the present invention, the surface of a thermoplastic substrate is modified to promote adhesion of the metal to the substrate. More specifically, the surface of the thermoplastic substrate is modified by heating to enable decomposition of a catalyst precursor to the catalyst together with sufficient softening of the thermoplastic surface to enable the catalyst to penetrate the surface of the softened plastic and be anchored in place by the thermoplastic.

In a principle aspect of the present invention, a thermoplastic substrate having a melting point below 325° Centigrade is coated with a precursor of a catalyst for the electroless deposition of conductive metals, the precursor having a decomposition temperature below the melting point of the thermoplastic, and within the temperature range where the thermoplastic softens and a portion of the coated thermoplastic substrate corresponding to the conductive path is heated to a temperature sufficient to decompose the catalyst precursor to the catalyst and soften the thermoplastic substrate to partially melt without substantial decomposition and thereby anchor the catalyst to the substrate to provide nucleation sites for the electroless deposition of conductive metal to form the conductive path.

In a further aspect of the present invention, the coated plastic substrate is heated by directing a laser beam, preferably a focused carbon dioxide laser, to the portion of the substrate corresponding to the conductive path.

In a further aspect of the present invention, the coated catalyst precursor is removed from the unheated areas of the coated thermoplastic substrate before the electroless deposition step.

In the further aspect of the present invention, the melting point of the thermoplastic substrate is below 300° Centrigrade and is within 50°, preferably 30°, of the decomposition temperature of the catalyst precursor.

In the further aspect of the present invention, the thermoplastic substrate is a polyamide, preferably nylon 66 or nylon 6.

In a further aspect of the present invention, the catalyst precursor is applied to thermoplastic substrate from a solvent solution, the solvent of which wets but does not dissolve the thermoplastic.

In a further aspect of the present invention, the catalyst precursor is selected from the group consisting of: copper acetate, copper oxalate, copper carbonate, copper salicylate, copper butyrate, palladium diamine hydroxide, palladium acetate, palladium acetylacetate and palladium hexafluoroacetate.

In a further aspect of the present invention, the laser beam is directed to the coated thermoplastic substrate in a predetermined pattern comprising a plurality of paths.

In a further aspect of the present invention, the thermoplastic substrate is a three-dimensional member, which is moved relative to the laser beam to create a pattern of catalyst corresponding to the desired conductive path.

In a further aspect of the present invention, the thermoplastic substrate has at least one structural groove therein in a pattern corresponding to the conductive path.

Other features of the present invention will become apparent as the following description proceeds and upon reference to the drawings.

DESCRIPTION OF THE PREFERRED EMBODIMENT

The invention will now be described with reference to a preferred embodiment of an electrical component according to the present invention.

In accordance with the present invention, an electrical component having greatly improved adhesion of the conductive metal path, pattern or circuit to the substrate is provided. The component is made by heating a thermoplastic substrate having a melting point below 325° C. which has been coated with a precursor of a catalyst for electroless deposition of conductive metals to a temperature to decompose the catalyst precursor to the catalyst, soften and at least partially melt without substantial decomposition, the thermoplastic substrate to enable the catalyst to penetrate the surface of the substrate and be firmly anchored in place when the plastic is cooled. The component may be a structural or non structural element, may have a single conductive path or a circuit.

Figure 1:
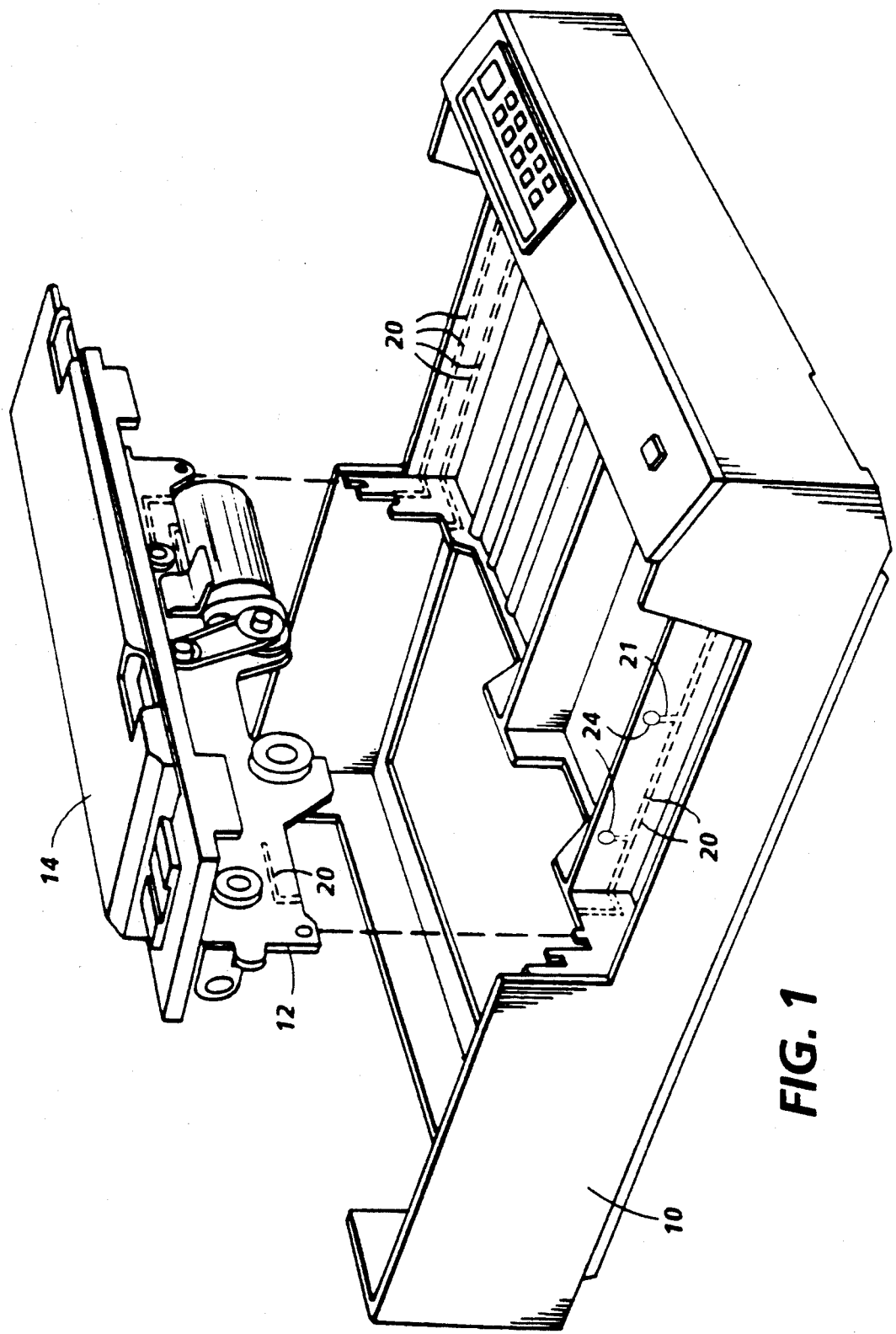
FIG. 1 is an isometric view partially exploded of a portion of the framed section of an electrostatographic printing apparatus with a representative illustration of a circuit pattern formed according to the practice of the present invention.

Referring now to FIGS. 1 and 2, the significance of the present invention will be appreciated. In FIG. 1 a structural frame 10, together with drive module 12 and platen drive module 14, are illustrated as parts of an electrostatographic reproducing apparatus. For further description of the machine elements and its manner of operation, attention is directed to U.S. Pat. No. 4,563,078. Also illustrated are electroconductive paths or traces 20 which may be formed directly into the machine support frame 10 with the technique according to the present invention. Also illustrated are conductive traces 21 through vias 24.

Figure 2A:
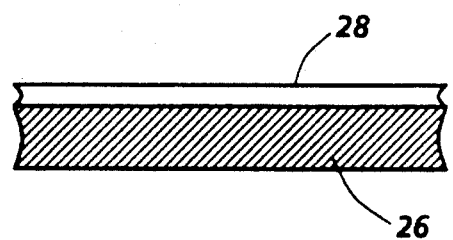
FIGS. 2A, 2B, 2C, 2D and 2E are views in cross section of the thermoplastic substrate during different stages in the process of forming the conductive path.

FIGS. 2A to 2E are enlarged cross sectional representations of the electrical component during several stages of its manufacture according to the technique of the present invention. In FIG. 2A the substrate 26 has been coated on one surface with the catalyst precursor 28.

Figure 2B:
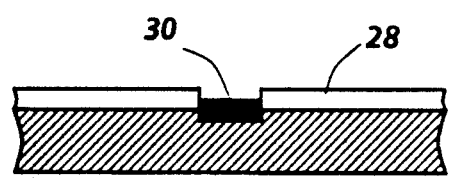

FIG. 2B illustrates the condition of the substrate after it has been exposed to a pattern of heat, such as, for example, by exposure to a laser beam to decompose the catalyst precursor to volatile gases and catalyst particles 30 which penetrate the surface of the thermoplastic substrate 26 and become anchored thereto as the substrate cools.

Figure 2C:
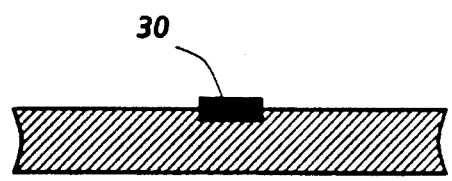

FIG. 2C illustrates the embodiment wherein the catalyst precursor 28 has been removed from the unheated portions of the thermoplastic substrate.

Figure 2D:
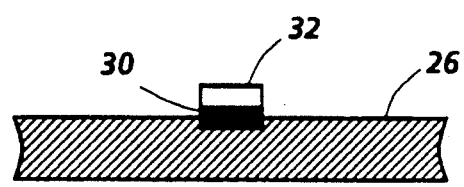

FIG. 2D illustrates the structure including a conductive metal layer 32 which has been electrolessly deposited on the exposed catalyst 30 which is thermally adhered to the plastic substrate 26.

Figure 2E:
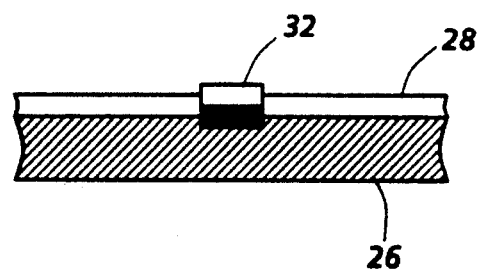

FIG. 2E illustrates the alternative embodiment wherein catalyst precursor 28 has not been removed from the unheated areas.

Any suitable thermoplastic substrate may be used in the practice of the present invention which has a melting point below 325° Centigrade and preferably has a melting point below 300° Centigrade. The catalyst precursors employed in the practice of the present invention typically have thermal decomposition temperatures below about 260° C. and generally in the range of 200°–260° C. We have found that the optimum adhesion is achieved by selecting a thermoplastic having a melting point which is within 50° of the decomposition temperature of the catalyst precursor and preferably is within 30° of the decomposition of the catalyst precursor. This enables the decomposition of the catalyst precursor to volatile materials and catalyst at about the same temperature that the thermoplastic is substantially softened with partial but not substantial melting nor decomposition. This enables the catalyst particles to penetrate the surface of the thermoplastic and become anchored there when the thermoplastic cools. Typical thermoplastics include the engineering grade plastics such as, polyvinyl chloride, polyphenylene oxide such as Noryl, polycarbonates, ABS, blends of ABS with polycarbonate and other plastics and polyamide. The polyamides nylon 66, and nylon 6, are particularly preferred for their superior adhesion properties. If desired, the thermoplastic may be in pure form or can be filled with conventional fillers such as glass fibers and clays or foamed to reduce weight in a conventional manner. In an alternative embodiment, substrates made from thermosetting plastics may be employed when they are precoated with a suitable thermoplastic layer.

The catalyst is typically selected to participate in the electroless deposition of conductive metals by providing nucleation sites for the metals. Typical catalyst precursors having decomposition temperatures between 200° and 260° Centigrade, include copper acetate, copper oxalate, copper carbonate, copper salicylate, copper butyrate, palladium diamine hydroxide, palladium acetate, palladium acetyl acetate, palladium hexa fluroacetylacetate, bis(acetonitrile)palladium(II) chloride, bis(benzonitrile)palladium(II) chloride, allylpalladium chloride dimer, and the platinum analogs of the above palladium compounds. Palladium acetate is particularly preferred because it is commercially available and decomposes cleanly and predictably at one of the lower decomposition temperatures of 220° C. to carbon dioxide and acetic acid. Further, it is soluble in solvents such as acetone and alcohols which are harmless to thermoplastics.

The catalyst precursor may be coated on the thermoplastic substrate in any suitable manner in either a pattern corresponding to the final conductive path desired or over the entire surface of the thermoplastic substrate. Typically, it is applied as a solvent solution in concentrations of from 1 to about 5 percent in water or organic solvents such as acetone, methyl ethyl ketone, ethyl alcohol, methyl alcohol, isopropyl alcohol, butyl alcohol, methyl isobutyl ketone, toluene, ammonia, chlorobenzene and methylene chloride. The solvent should be selected so that it dissolves the catalyst precursor but does not dissolve or otherwise tackify the thermoplastic substrate. The solvent solution may be applied by brushing, spin coating, dip coating to provide a substantially uniform coating on the surface of the thermoplastic substrate which upon decomposition provides the nucleation sites anchored in the softened thermoplastic substrate for the subsequent metal plating. After applying the solvent solution to the thermoplastic subtrate, the solvent typically is permitted to evaporate without heating.

Typically, the coated plastic substrate is heated in a pattern corresponding to the desired conductive trace by exposure to a laser beam. The laser is selected to have a wave length that the thermoplastic substrate can absorb. The carbon dioxide laser is particularly preferred as all the standard engineering thermoplastics mentioned above, absorb at its wave length of 10.6 microns. Typically, a low powered 20–25 watts per $cm^2$., focused 1 mm. diameter spot, carbon dioxide laser can be scanned across the plastic surface at speeds from 0.5 mm. per second to 5 cm. per second to heat the catalyst precursor to a temperature above the thermal decomposition temperature where precursor is voltalized with gases coming off and the metallic catalyst deposit is left to penetrate the softened and partially melted thermoplastic surface and become anchored in the thermoplastic surface as it cools. As previously discussed above, optimum adhesion is obtained when the difference between the melting point of the thermoplastic and the decompositioned temperature of the catalyst precursor is less than 50° Centigrade and preferably less than 30° Centigrade. Following exposure to the laser beam and creation of the anchored catalyst path in the thermoplastic surface, the catalyst precursor in the unexposed or unheated areas may be removed with a solvent, such as the solvent from which the catalyst precursor was originally supplied.

The final step in the formation of the electrical component according to the present invention is the electroless plating of conductive metal, such as, copper or nickel on the catalyst nucleation sites anchored in the thermoplastic substrate. Standard electroless plating techniques from a bath of, for example, copper sulfate for copper plating the catalyzed path are in accordance with the following, generally accepted mechanism:

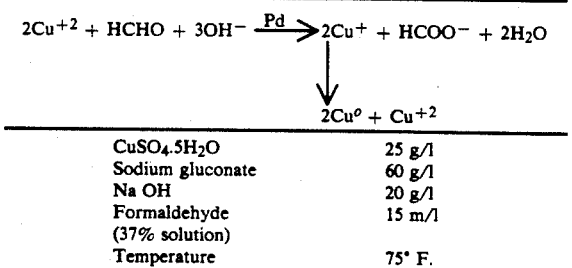

| | |
|---|---|
| $CuSO_4.5H_2O$ | 25 g/l |
| Sodium gluconate | 60 g/l |
| NaOH | 20 g/l |
| Formaldehyde (37% solution) | 15 m/l |
| Temperature | 75° F. |

Copper deposits of 30 microinch thickness are typically produced in about 20 minutes. For low power applications this may be sufficient. However in many applications, thickness of up to 1000 microinch may be required. The additional copper thickness is most effectively accomplished by further electrolytically plating in an acid copper sulphate solution under the following conditions:

| | |
|---|---|
| $CuSO_4.5H_2O$ | 250 g/l |
| $H_2SO_4$ | 75 g/l |
| CL— | 40 ppm |
| gelatin | 40 ppm |
| Temperature | 130° F. |
| Current Density | 1 to 10 amps/square decimeter |

Figure 3:
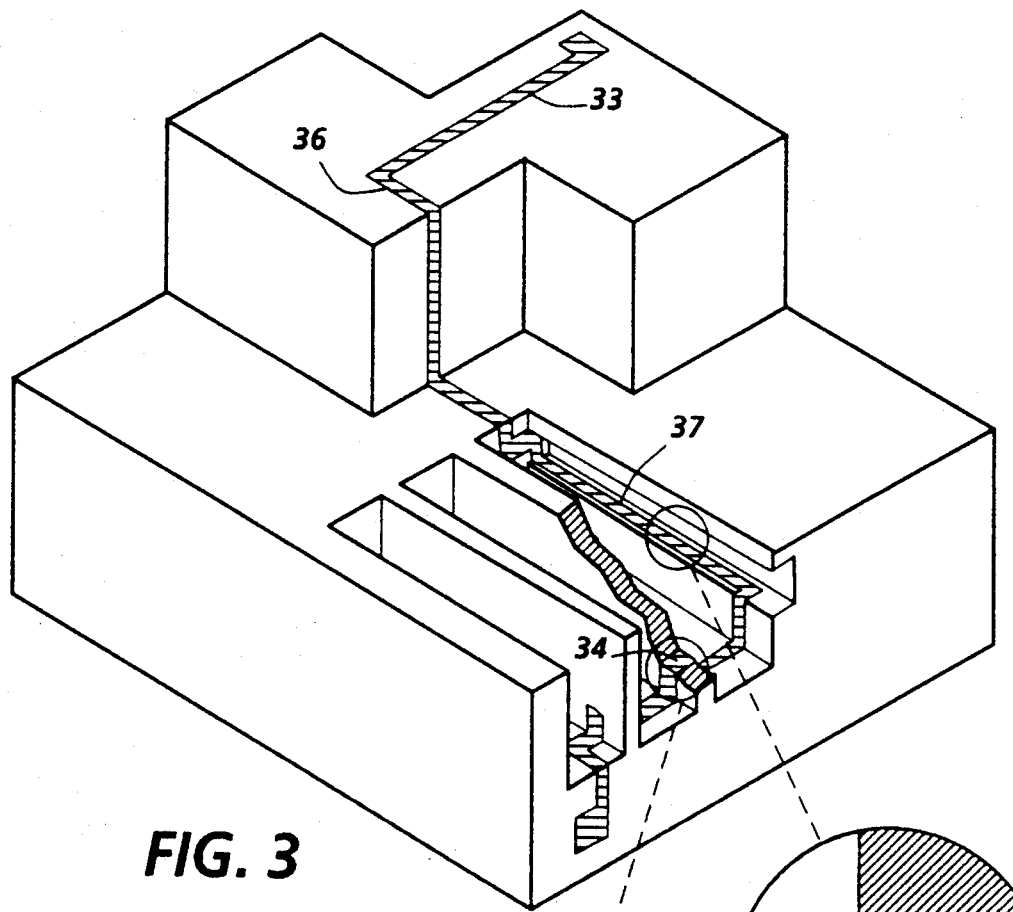
FIG. 3 is an isometric view of a three-dimensional part with enlarged cutaway view 3A illustrating grooves on both sides connected with a via and enlarged cutaway view 3B illustrating an electroless pattern in a groove.
Figure 3A:
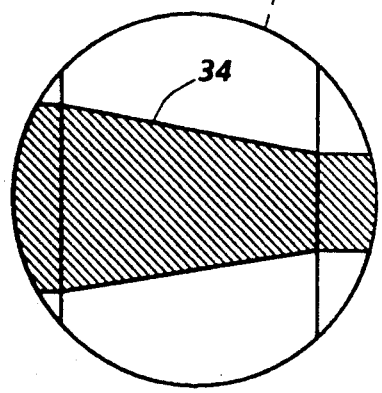
Figure 3B:
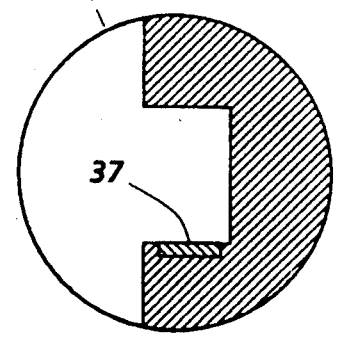
Figure 4:
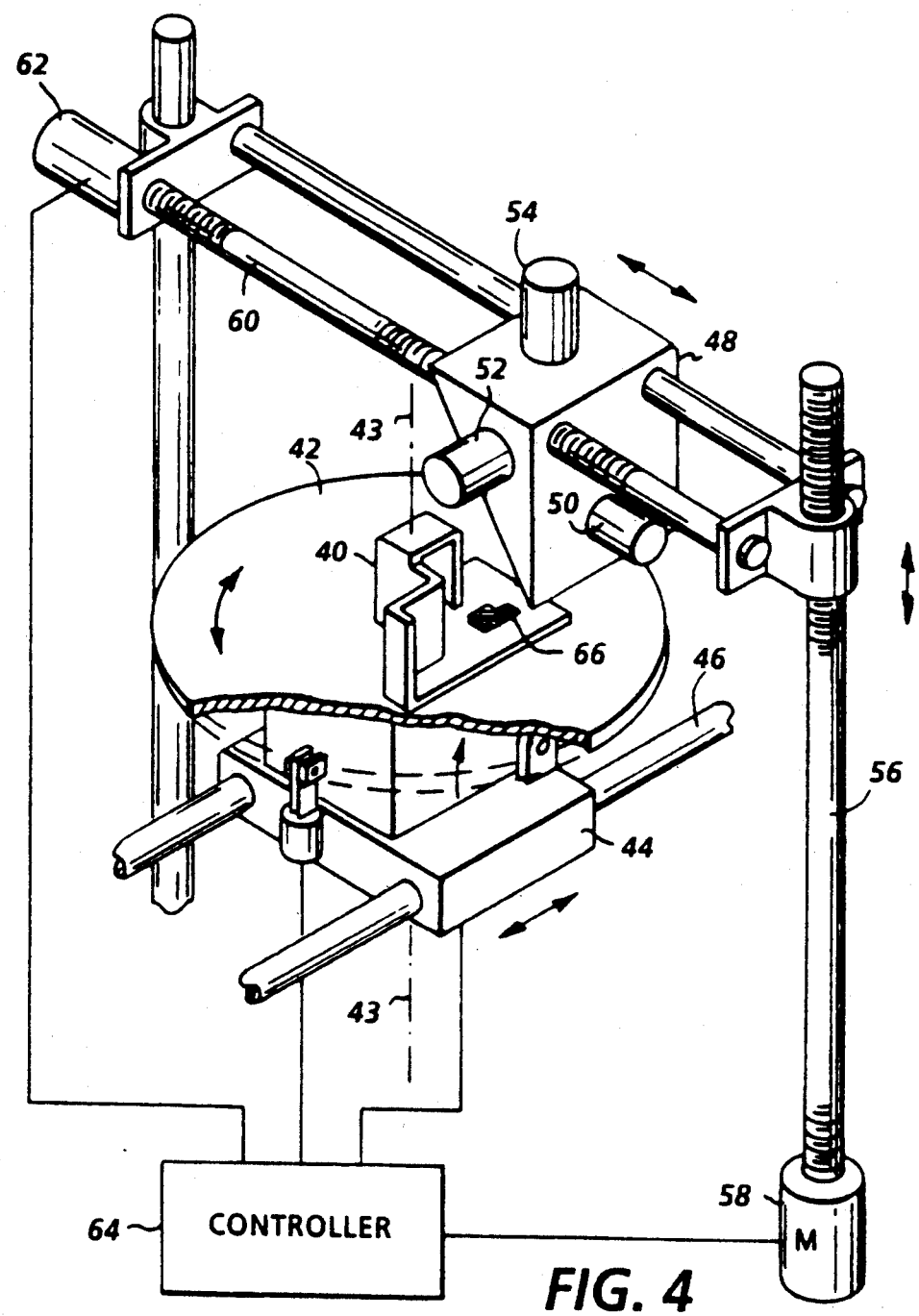
FIG. 4 is a schematic illustration of a system performing the exposure of the electrically conductive paths in a structural member.

Attention is now directed to FIGS. 3 and 4. FIG. 3 illustrates a three dimensional part having a continuous electroless pattern on multiple faces shown to transcend a corner as illustrated by 35 and 36. The trace continues down and is illustrated to pass through two vertical walls one of which is shown in enlarged cutaway 3A with via 34. The via of FIG. 3A has a tapered wall configuration from one side to the other side with constantly changing cross section of the passage way, wherein the passage way can taper down from a maximum cross section on one side to a minimum cross section on the other side or alternatively, it can taper down from a maximum cross section at both sides to a minimum cross section between the first and second sides. With this kind of geometry the walls of the via may be coated from the side having a maximum cross section or alternatively from both sides to form a catalyst path from one side to the other, whereby during subsequent electroless plating the conductive metal is plated in the via. Enlarged cutaway FIG. 3B also illustrates the use of grooves 37 in the thermoplastic substrate as the location of the conductive path in the thermoplastic substrate, which will be coated with the catalyst precursor exposed to the laser beam and subsequently electrolessly plated to form a continuous electroless pattern, thereby providing additional protection for the plated pattern against damage from abrasion.

Attention is directed to FIG. 4 which schematically illustrates a manner in which a plurality of conductive paths representing circuit patterns can be prepared in a part. The part 40 is secured to table 42 which is rotatably mounted about the center axis 43 of a motor shaft (not shown) in the motor box 44. In addition, the table is movable in the XY plane by movement of worm gear 46 by another motor (not shown) in the motor box 44. The laser scanning carriage 48 has three laser ports 50, 52, 54, one directed in each direction with the carriage movable vertically by worm gear 56 and motor 58 and horizontally by worm gear 60 and motor 62. The movement of the table 42 and the scanning carriage 48 is controlled by a programmable controller 64 to form the preselected pattern of conductive traces in the part 40. If desired, a mask 66 having a predetermined pattern may be placed on the part. The laser scanning operation may be carried out in an input duct to bathe the part in an inert gas such as nitrogen, or in a vacuum chamber. Alternatively or in addition, an exhaust hose may be placed adjacent the part being marked to remove any noxious materials produced by the heating.

EXAMPLE I

A thermoplastic substrate of polyvinyl chloride was thin coated with a solution (less than 50 mg. per ml.) of palladium (II). acetate as a catalyst precursor in acetone. Following coating the substrate acetone was permitted to evaporate. A focused one mm. spot diameter carbon dioxide laser beam, 20–25 watts per cm sq. was scanned across the coated substrate at a rate of 0.5 mm. per second, which heated the thermoplastic substrate above the thermal decomposition temperature of 220° Centigrade of the palladium acetate, thereby liberating decomposition gases such as carbon dioxide and acetic acid while leaving reduced palladium metal on the softened plastic surface. The thermoplastic substrate was then rinsed in acetone to remove the palladium acetate in the unexposed areas. Subsequent immersion of the plastic in a standard commercial electroless copper plating solution, provided a thick durable copper plating of 25 microns in only 15 hours in the laser exposed regions. Adhesion of the resulting conductor pattern was checked using IPC-L-108 Test Method. Accordingly, pressure sensitive tape (F.S. A-A-113), ½ inch wide×2 inch long strips were firmly applied across the surface of the conductor pattern. The tape was then removed by rapidly applying manual force roughly perpendicular to the circuit pattern. This test was repeated two times. On visual inspection of both the circuit and tape specimens, a good bond of the plated circuit to the thermoplastic substrate was indicated by the lack of any evidence of adhesive failure.

EXAMPLES II AND III

The procedure of Example I was repeated for nylon 66 and nylon 6 substrates under the same conditions except that the laser power was 30–35 watts/cm². Both nylon 66 and nylon 6 passed the above described adhesive tape test. Adhesion for both samples was better than Example I in that the electrolessly deposited traces were difficult to physically scrape off with a metal edge without removing some of the substrate

EXAMPLE IV

The procedure of Example I was repeated for a polyimide substrate except that the laser power was 40–45 watts/cm². Electroless traces were formed on the polyimide but they did not pass the adhesive tape test since the traces came right off the substrate when the adhesive tape was removed. Since this polyimide decomposes at a temperature greater than 800° C. the laser exposure was insufficient to soften the substrate to enable the catalyst to penetrate the surface and adhere to it.

Accordingly, the present invention provides a simple, economical alternative to conventional wiring and the construction of electrical components. It further provides improved adhesion between a substrate and an electroless plated metal path. The electrical component is produced in a very simple process with few steps and an economical process wherein the catalyst precursor in the unexposed areas on the substrate may be recovered and reused. Furthermore, there is no surface treatment other than the simple coating and the width of the trace can be easily controlled by controlling the laser spot size or mask configuration. In addition, the manufacturing process lends itself to automation and that it may be used in a programmable, controllable process.

The disclosures of the patents and other references as well as the co-pending application referred to herein are hereby specifically and totally incorporated herein by reference.

While the invention has been described with specific reference to elastostatographic copier and printer machines, it will be appreciated that it has application to a large array of machines with electrical components. Accordingly, it is intended to embrace all such alternatives and modifications, as may fall within the spirit and scope of the appended claims.

We claim:

1. A method of forming at least one electrically conductive path in a plastic substrate comprising providing a thermoplastic substrate having a melting point below 325° C., coating said substrate with a precursor of a catalyst for the electroless deposition of conductive metals, said catalyst precursor having a decomposition temperature below the melting point of said thermoplastic and within the temperature range where said thermoplastic softens, heating the portion of said coated thermoplastic substrate corresponding to said conductive path to a temperature sufficient to decompose said catalyst precursor to said catalyst and soften said thermoplastic; said substrate, catalyst precursor and temperature being selected such that on heating to the temperature the precursor decomposes to the catalyst, the thermoplastic softens and at least partially melts without substantial decomposition to enable the catalyst to penetrate the surface of the thermoplastic and become anchored thereto to provide nucleation sites for the subsequent electroless deposition of conductive metal and depositing conductive metal by electroless deposition on said heated portion to form said conductive path.

2. The method of claim 1 including the step of removing the coated catalyst precursor from the unheated areas of the thermoplastic substrate before the electroless deposition step.

3. The method of claim 1 wherein said heating comprises directing a laser beam to the portion of the substrate corresponding to said conductive path.

4. The method of claim 3 wherein said laser beam is from a focused carbon dioxide laser.

5. The method of claim 1 wherein the melting point of the thermoplastic substrate is below 300° C.

6. The method of claim 1 wherein the melting point of the thermoplastic substrate is within 50° C. of the decomposition temperatures of the catalyst precursor.

7. The method of claim 6 wherein the melting point of the thermoplastic substrate is within 30° C. of the decomposition temperature of the catalyst precursor.

8. The method of claim 1 wherein the thermoplastic substrate is a polyamide.

9. The method of claim 8 wherein the polyamide is selected from the group consisting of nylon 66 and nylon 6.

10. The method of claim 1 wherein said catalyst precursor is applied to the thermoplastic substrate from a solvent solution the solvent of which wets but does not dissolve the thermoplastic.

11. The method of claim 2 wherein the catalyst precursor is removed from the unheated areas of the thermoplastic substrate by rinsing with a solvent to dissolve the catalyst precursor, said solvent wetting but not dissolving the thermoplastic.

12. The method of claim 1 wherein said catalyst precursor is selected from the group consisting of copper acetate, copper oxalate, copper carbonate, copper salicylate, copper butyrate, palladium diamine hydroxide, palladium acetate, palladium acetylacetate, palladium hexafluoroacetate and palladium nitrate.

13. The method of claim 12 wherein said catalyst precursor is palladium acetate.

14. The method of claim 13 wherein the palladium acetate is applied to the substrate from an acetone solution thereof and said conductive metal is copper.

15. The method of claim 3 wherein said laser beam is directed to said coated thermoplastic substrate in a predetermined pattern.

16. The method of claim 15 wherein said predetermined pattern comprises a plurality of paths.

17. The method of claim 3 wherein said coated thermoplastic substrate is a three dimensional member and including the step of moving said substrate and said laser beam relative to each other to create a pattern of catalyst corresponding to said conductive path.

18. The method of claim 1 wherein said thermoplastic substrate has at least one structural groove therein, in a pattern corresponding to said conductive path.

* * * * *